United States Patent [19]

Hieber et al.

[11] 4,189,684
[45] Feb. 19, 1980

[54] MICROWAVE POWER COMBINER

[75] Inventors: Allen L. Hieber, Waltham; Clifford A. Drubin, Groton; George Jerinic, Acton, all of Mass.

[73] Assignee: Raytheon Company, Lexington, Mass.

[21] Appl. No.: 957,251

[22] Filed: Nov. 2, 1978

[51] Int. Cl.² ............................................. H03B 7/14
[52] U.S. Cl. ...................................... 331/56; 331/101; 331/107 P; 331/107 C; 333/228
[58] Field of Search .................. 331/46, 56, 96, 101, 331/107 DP, 107 P, 107 C; 333/228

[56] References Cited

U.S. PATENT DOCUMENTS

| | | | |
|---|---|---|---|
| 3,582,813 | 6/1971 | Hines | 331/56 |
| 3,783,401 | 1/1974 | Oltman, Jr. | 333/228 X |
| 3,931,587 | 1/1976 | Harp et al. | 331/56 |
| 4,143,334 | 3/1979 | Dydyk | 331/56 |

Primary Examiner—Siegfried H. Grimm
Attorney, Agent, or Firm—Philip J. McFarland; Joseph D. Pannone

[57] ABSTRACT

A microwave power combiner is shown to consist of a plurality of coaxial diode oscillators disposed on the periphery of a circularly cylindrical cavity operating in the $TM_{020}$ mode, such cavity containing mode suppressor means to prevent any mode other than the $TM_{020}$ from operating.

5 Claims, 1 Drawing Figure

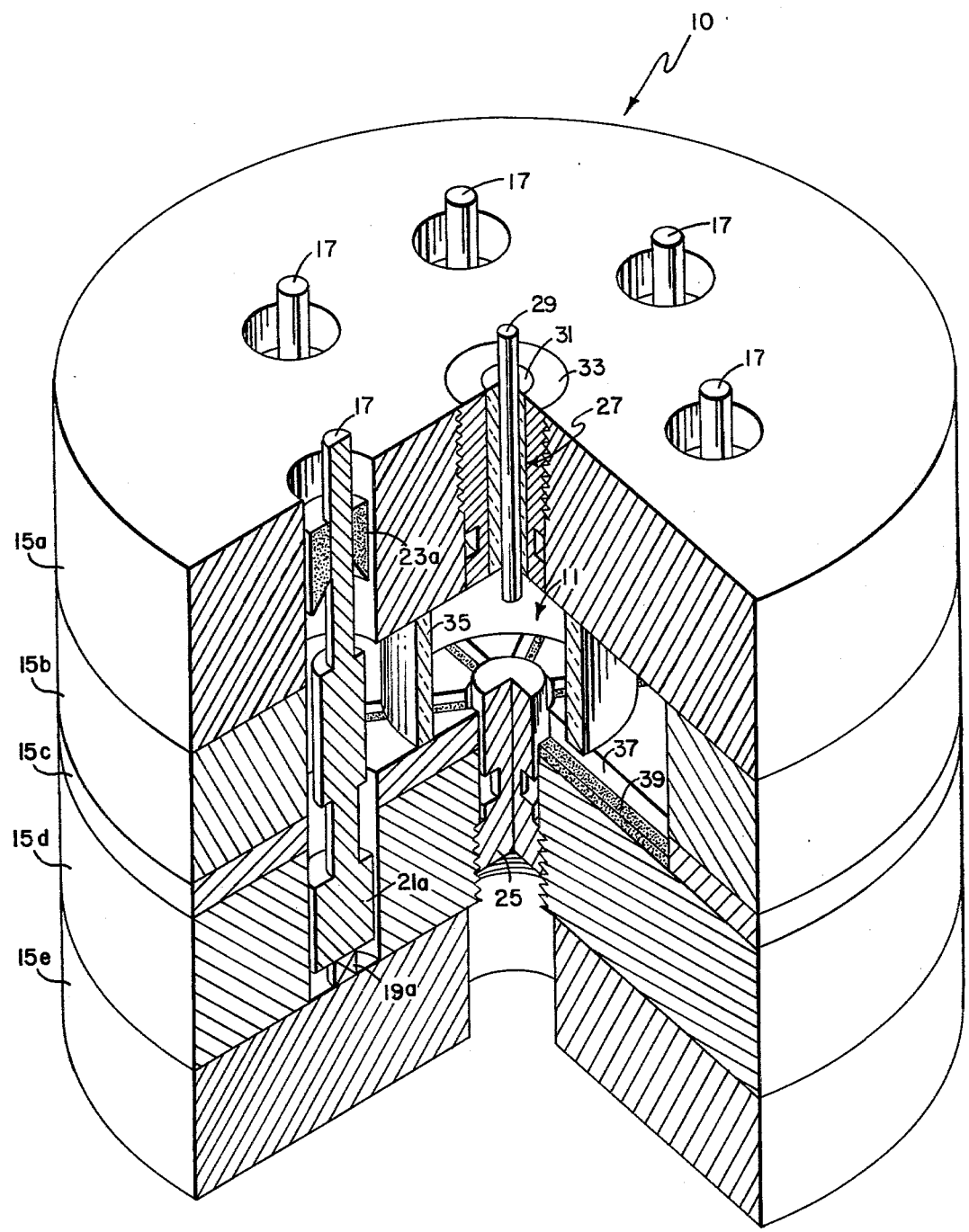

MICROWAVE POWER COMBINER

BACKGROUND OF THE INVENTION

This invention pertains generally to $TM_{0N0}$ mode circularly cylindrical cavity power combiners and, in particular, a combiner of such type wherein the $TM_{020}$ mode is present and other undesired higher modes are suppressed.

It is known in the art (see U.S. Pat. No. 3,931,587) that a microwave power source may be formed by providing a cylindrical cavity wherein outputs of a plurality of coaxial IMPATT diode oscillators may be combined. In such a source, coaxial IMPATT diode oscillators are symmetrically disposed on the periphery of the cylindrical cavity (which is dimensioned to ensure operation in the $TM_{010}$ mode). The number of coaxial IMPATT diode oscillators which may be so disposed is determined by the length of such periphery with the result that the amount of microwave power out of such a combiner is similarly determined.

Obviously, if the length of the periphery of a cylindrical cavity were to be increased a greater number of coaxial IMPATT diode oscillators could be disposed on the periphery of such a cavity with a concomitant increase in microwave power out. However, simply increasing the length of the periphery of a cylindrical cavity, say to support the $TM_{020}$ mode, is not feasible because other undesired or higher order modes may also be present. Oscillations in any undesired higher order modes must either be suppressed or be shifted in frequency so that dissipation of power in such oscillations and instability in operation are prevented.

SUMMARY OF THE INVENTION

With the foregoing background of the invention in mind, it is a principal object of this invention to provide an improved microwave power source wherein a plurality of coaxial IMPATT diode oscillators is disposed on the periphery of a cylindrical cavity operated in the $TM_{020}$ mode.

The foregoing and other objects of the invention are attained by providing a microwave power source including a cylindrical cavity dimensioned to support the $TM_{020}$ mode, a plurality of coaxial IMPATT diode oscillators disposed on the periphery of such cavity in a coupling relationship thereto and means for suppressing modes of operation of the cylindrical cavity other than the desired $TM_{020}$ mode.

BRIEF DESCRIPTION OF THE DRAWINGS

Other objects and many of the attendant advantages of the invention will be readily appreciated as the same becomes better understood by reference to the following detailed description when considered in connection with the accompanying drawing wherein the single FIGURE is an isometric drawing, partially cut away and simplified, of a microwave power combiner according to the invention.

DESCRIPTION OF THE PREFERRED EMBODIMENT

Before proceeding with a detailed description of the single FIGURE it is noted here in passing that, for the sake of simplicity, only the elements necessary to an understanding of the invention have been illustrated. Other elements, such as mounting hardware, power supplies for the coaxial IMPATT diode oscillators and connections to an output load are not shown. It is felt that such unillustrated elements may be easily provided by one of ordinary skill in the art and need not here be shown or explained.

Referring now to the single FIGURE, the preferred form of a microwave power source 10 is shown to include a cavity 11 defined by metallic plates 15a, 15b, 15c, such cavity being dimensioned to support the $TM_{020}$ mode at the desired operating frequency, here an x-band frequency of, say, 10 GHz. The cavity 11 is effective to combine the power output from a plurality of coaxial IMPATT diode oscillators (not numbered). Each one of such oscillators is here formed by boring a hole (not numbered) through metallic plates 15a, 15b, 15c and 15d as shown to form the outer conductor of a diode oscillator circuit. A center conductor 17, shaped as shown, an IMPATT diode 19a and a matched load 23a are positioned within the hole (not numbered). The IMPATT diode 19a is connected to the metallic plate 15e in any convenient manner, as by means of soldering.

The portion of the center conductor 17 adjacent to the IMPATT diode 19a is shaped to form an impedance transformer section 21a which is dimensioned in a conventional manner to match the relatively low impedance of the IMPATT diode 19a to the relatively high impedance at the center plane of the cavity 11. The portion (not numbered) of the center conductor 17 at the cavity 11 is increased in diameter to stabilize the arrangement over a greater operating band. This is necessitated by the fact that a part of the outer wall of the cavity 11 forms the outer conductor of the coaxial oscillator (not numbered) in this region.

A tuning plug 25 and a probe 27 are adjustably mounted as shown to project into the center of the cavity 11. The probe 27 is, in effect, a length of coaxial line with a center conductor 29, a dielectric insulating sleeve 31 and a metallic shield 33 threaded as shown in the metallic plate 15a to permit adjustment of the distance to which the center conductor 29 may be inserted in the cavity 11. The exterior portion (not shown) of the probe 27 includes a coaxial connector (not shown) to allow connection to a load (not shown). The tuning plug 25 is threaded in the metallic plate 15d to permit adjustment of the distance to which the former may be inserted into the cavity 11, thereby to adjust the resonant frequency of the latter.

To complete the assembly being described, a dielectric annulus 35, here made of alumina, is positioned as shown within the cavity 11. The annulus 35 is effective to shift the frequencies at which undesired higher order modes (such as the $TM_{210}$ and the $TM_{110}$) occur away from the frequency of the $TM_{020}$ mode. It is noted here in passing that, although the dielectric annulus 35 is also effective to shift the frequency of the $TM_{310}$ mode closer to that of the $TM_{020}$ mode, the frequencies of these two modes still differ from each other with the result that little or no power is dissipated in the $TM_{310}$ mode. In order to further suppress undesired higher order modes within the cavity 11 a plurality of slits (such as slit 37) is formed in the metallic plate 15c (which plate in turn forms the bottom surface of the cavity 11). Slit 37, partially filled with any known absorbing material 39 for radio frequency energy, is disposed between adjacent ones of the coaxial diode oscillators (not numbered) and radially of the cavity 11, as shown. For example, the absorbing material here used is that known as "Eccosorb" manufactured by the Emerson-Cummings Company, Canton, Massachusetts. The slit 37 and the absorbing material 39 are effective to attenuate currents due to undesired higher order modes.

In the present instance, the thickness of the wall of the dielectric annulus 35 and the amount of absorbing material 39 have been empirically determined. Satisfactory results have been obtained when the dimensions of the wall of the dielectric annulus is approximately $r/2.3 \pm a$, where "r" is the radius of the cavity 11, "r/2.3" corresponds to the position of the electric field null of the $TM_{020}$ mode, and "a" equals about 0.025". Also, good results have been obtained when the absorbing material 39 fills the slits 37 to two-thirds their depth.

Having described a preferred embodiment of this invention, it will now be apparent to one of skill in the art that many changes may be made without departing from the inventive concepts. For example, the IMPATT diodes could just as well be mounted in a cylindrical mounting plate which could be threaded into the metallic plate 15e. It is felt, therefore, that this invention should not be restricted to its disclosed embodiment, but rather should be limited only by the spirit and scope of the appended claims.

What is claimed is:

1. A microwave power combiner comprising:
   (a) a cylindrical cavity dimensioned to operate in the $TM_{020}$ mode;
   (b) means disposed within such cavity to suppress modes other than the $TM_{020}$ mode; and
   (c) a plurality of coaxial diode oscillators disposed on the periphery of the cylindrical cavity in a coupling relationship thereto.

2. A microwave power combiner as in claim 1 wherein the mode suppression means includes a hollow cylindrical member disposed within the cylindrical cavity and coaxially therewith, such member being fabricated from a dielectric material.

3. A microwave power combiner as in claim 2 wherein the dielectric material is alumina.

4. A microwave power combiner as in claim 3 wherein the outer and inner radii of the hollow cylindrical member are equal, respectively, to $r/2 + a$ and $r/2 - a$, where "r" is the radius of the cylindrical cavity and "a" is an empirically determined dimension.

5. A microwave power combiner as in claim 4 wherein the mode suppression means includes, additionally, a radially extending slot formed in one end wall of the cylindrical cavity between each successive pair of coaxial diode oscillators, each such slot being partially filled with an absorber of microwave energy.

* * * * *